United States Patent
Coln et al.

(10) Patent No.: US 10,809,792 B2
(45) Date of Patent: Oct. 20, 2020

(54) CORRELATED DOUBLE SAMPLING AMPLIFIER FOR LOW POWER

(71) Applicant: Analog Devices, Inc., Norwood, MA (US)

(72) Inventors: Michael C. W. Coln, Lexington, MA (US); Michael Mueck, Andover, MA (US)

(73) Assignee: Analog Devices, Inc., Norwood, MA (US)

( * ) Notice: Subject to any disclaimer, the term of this patent is extended or adjusted under 35 U.S.C. 154(b) by 148 days.

(21) Appl. No.: 16/103,963

(22) Filed: Aug. 16, 2018

(65) Prior Publication Data

US 2020/0057484 A1 Feb. 20, 2020

(51) Int. Cl.
*H03M 1/00* (2006.01)
*G06F 1/3287* (2019.01)
(Continued)

(52) U.S. Cl.
CPC ....... *G06F 1/3287* (2013.01); *H03F 3/45475* (2013.01); *H03M 1/1245* (2013.01);
(Continued)

(58) Field of Classification Search
CPC ............... G06F 1/3287; H03F 3/45475; H03F 2200/129; H03F 2203/45116;
(Continued)

(56) References Cited

U.S. PATENT DOCUMENTS

| 5,841,310 A | * | 11/1998 | Kalthoff | G06G 7/1865 |
| | | | | 327/337 |
| 5,872,470 A | * | 2/1999 | Mallinson | G11C 27/026 |
| | | | | 327/94 |

(Continued)

FOREIGN PATENT DOCUMENTS

EP 2779444 9/2014

OTHER PUBLICATIONS

"International Application Serial No. PCT US2019/044919, International Search Report dated Nov. 11, 2019", 5 pgs.

(Continued)

*Primary Examiner* — Jean B Jeanglaude
(74) *Attorney, Agent, or Firm* — Schwegman Lundberg & Woessner, P.A.

(57) ABSTRACT

A signal acquisition or conditioning amplifier can be configured and controlled to use correlated doubling sampling (CDS) of a differential input signal, and a storage capacitor in a capacitive or other feedback network, a low power operational transconductance amplifier (OTA) capable of being powered down between CDS samplings, and which can be operated in a manner that provides good performance characteristics while still providing low or efficient power consumption. The amplifier and other signal processing circuitry can allow power to be scaled down, when less signal measurement throughput is needed, and to be scaled up, when more signal measurement throughput is needed. Such flexibility can help make the present approach useful for a wide range of signal acquisition and measurement (Continued)

applications. Precharging via buffer amplifiers can provide improved signal acquisition circuitry effective input impedance.

21 Claims, 1 Drawing Sheet

(51) Int. Cl.
  *H03F 3/45* (2006.01)
  *H03M 1/12* (2006.01)
  *H03M 1/38* (2006.01)
(52) U.S. Cl.
  CPC ......... *H03M 1/38* (2013.01); *H03F 2200/129* (2013.01); *H03F 2203/45116* (2013.01); *H03F 2203/45512* (2013.01); *H03F 2203/45544* (2013.01)
(58) Field of Classification Search
  CPC . H03F 2203/45512; H03F 2203/45544; H03F 3/45479; H03M 1/1245; H03M 1/38; H03M 1/1295; H03M 3/342; G11C 27/026
  USPC .......................................................... 341/122
  See application file for complete search history.

(56) References Cited

U.S. PATENT DOCUMENTS

| 6,617,567 | B2* | 9/2003 | Mukherjee | H03F 3/005 |
| | | | | 250/214 A |
| 7,138,848 | B2* | 11/2006 | Wu | G06G 7/184 |
| | | | | 327/337 |
| 7,180,366 | B2* | 2/2007 | Roos | H03F 3/08 |
| | | | | 330/282 |
| 7,667,501 | B2* | 2/2010 | Surendranath | G11C 27/026 |
| | | | | 327/337 |
| 9,461,625 | B1* | 10/2016 | Prandi | H03H 19/004 |
| 9,496,887 | B1 | 11/2016 | Quiquempoix et al. | |
| 9,699,395 | B1* | 7/2017 | Boemler | H04N 5/3575 |
| 2008/0180136 | A1 | 7/2008 | Wu et al. | |
| 2011/0080925 | A1 | 4/2011 | Molina et al. | |
| 2013/0194118 | A1* | 8/2013 | Coln | H03M 1/0682 |
| | | | | 341/155 |
| 2014/0160331 | A1 | 6/2014 | Murakami et al. | |
| 2017/0374307 | A1* | 12/2017 | Kim | H04N 5/3696 |

OTHER PUBLICATIONS

"International Application Serial No. PCT US2019/044919, Written Opinion dated Nov. 11, 2019", 9 pgs.

* cited by examiner

CORRELATED DOUBLE SAMPLING AMPLIFIER FOR LOW POWER

TECHNICAL FIELD

This document pertains generally, but not by way of limitation, to signal processing circuitry and methods, and more particularly but not by way of limitation to a correlated double sampling amplifier suitable for low power instrumentation applications.

BACKGROUND

High quality low power signal processing of sensor and other analog input signals is desirable, particularly in battery-powered or implantable applications. Many signal acquisition and analog-to-digital signal conversion circuits do not provide accuracy and low noise signal processing performance while also providing low power consumption.

SUMMARY

An illustrative non-limiting example of an analog signal processing channel can include an input amplifier circuit for sampling an analog input signal, an analog-to-digital converter (ADC) circuit for converting the analog input signal, as buffered by the amplifier, into a digital value, a voltage reference circuit for providing a voltage reference to the ADC for performing an analog-to-digital (A2D) conversion, digital post-processing circuitry for further performing signal processing (e.g., decimation or other filtering, etc.), and control circuitry for timing operation of the ADC and switching circuitry used in the signal processing channel.

For battery-powered or other low power applications, average integrated power (e.g., energy consumed per signal measurement) matters. Some low-power applications need only infrequent signal acquisitions and corresponding signal processing for measurement. Powering down signal processing components between signal acquisitions and corresponding measurements can help save power. Such powering down can include putting one or more circuits into a low-power consumption state, or can include turning off one or more circuits, e.g., putting such circuits into a no power consumption state.

Not all signal processing circuitry components are equally suited for being powered down into a standby or inactive state. Some components may still have relatively high inactive quiescent power consumption. The present inventors have recognized, among other things, that it may be desirable, for example, to reduce inactive power toward or to a level that is at or below that of a self-discharge rate of a battery being used to power the signal processing circuitry.

Some components may additionally or alternatively have high active state power consumption or long turn-on or turn-off time requirements, which can lead to poor power consumption characteristics. Both active power consumption and inactive power consumption are important figures of merit in low power signal acquisition and processing systems. Providing users with flexibility to configure system that can span different throughput needs while scaling power consumption to accommodate such different throughput needs can also be helpful. In sum, if a large "power versus throughput" scaling span can be provided to the user, a wider range of applications can be better served by the same circuitry, leading to a more useful product.

The present inventors have also recognized, among other things, that for powering down signal acquisition, processing, and conversion circuitry, a successive approximation routine (SAR) ADC can be configured to use relatively fixed energy per A2D conversion, and can be carefully configured to be powered down into an inactive state with low inactive state leakage current, and a voltage reference circuit can also be carefully configured to support power-cycling or powering down into a low power state in spite of the long-time constant noise filtering needed to reduce the noise bandwidth of such a voltage reference circuit.

However, most signal conditioning amplifiers, for buffering, amplifying, or conditioning the input signal for further signal processing, signal conversion, or both, can face significant limitations including incomplete power-down performance, designed for resistive loads that consume power, and even chopper amplifiers often are limited by slow power-up settling, and provide chopping that is not always well-synchronized with the signal measurements to optimize power consumption.

For signal acquisition or signal conditioning amplifiers, the present inventors have recognized a need for, among other things: low inactive power consumption; fast turn-on from a powered-down state; low offset voltage; low referred-to-input (RTI) noise (including low 1/f noise); good signal gain (e.g., to reduce RTI noise of an ADC coupled to an output of the amplifier); and good common-mode rejection, particularly for acquiring a differential input signal from a sensor or other source.

The present document describes subject matter that can include a signal acquisition or conditioning amplifier that can be configured and controlled to use correlated doubling sampling (CDS) of a differential input signal, and a storage capacitor in a capacitive or other feedback network, a low power operational transconductance amplifier (OTA) capable of being powered down between CDS samplings, and which can be operated in a manner that provides good performance characteristics while still providing low or efficient power consumption. The amplifier and other signal processing circuitry can allow power to be scaled down, when less signal measurement throughput is needed, and to be scaled up, when more signal measurement throughput is needed. Such flexibility can help make the present approach useful for a wide range of signal acquisition and measurement applications.

A numbered list of non-limiting examples or aspects follows.

Aspect 1 can include or use subject matter (such as an apparatus, a system, a device, a method, a means for performing acts, or a device readable medium including instructions that, when performed by the device, can cause the device to perform acts, or an article of manufacture), such as can include or use signal acquisition circuitry for performing correlated double sampling (CDS) on a differential input signal, having components Vx and Vy, for low power signal processing. The signal acquisition circuitry can include an amplifier, including or coupled to a feedback network. The feedback network can include or be coupled to a storage capacitor. The amplifier can be configured to provide gain between first and second amplifier inputs and an amplifier output. An initialization switch can be arranged to initialize the storage capacitor before the CDS of the input signal. Control circuitry can be configured to control operation of a multiplexer to sequentially couple Vx and Vy to the first amplifier input, such as for respective first and second samplings of the CDS performed without or before reinitializing the storage capacitor.

Aspect 2 can include or use, or can optionally be combined with the subject matter of Aspect 1, to optionally include or use a first precharge switch, which can be configured to be controlled by the control circuitry to couple Vx to the first amplifier input via a first buffer amplifier for precharging the first amplifier input. A first settling switch can be configured to be controlled by the control circuitry to then couple Vx to the first amplifier input without the first buffer amplifier, such as for further settling the first amplifier input after precharging. A second precharge switch can be configured to be controlled by the control circuitry to couple Vy to the first amplifier input via a second buffer amplifier, such as for precharging the first amplifier input. A second settling switch can be configured to be controlled by the control circuitry to then couple Vy to the first amplifier input without the second buffer amplifier, such as for further settling the first amplifier input after precharging.

Aspect 3 can include or use, or can optionally be combined with the subject matter of one or any combination of Aspects 1 or 2, to optionally include or use the initialization switch arranged to initialize the storage capacitor before the CDS that includes precharging, settling, and sampling of each of Vx and Vy before reinitializing the storage capacitor.

Aspect 4 can include or use, or can optionally be combined with the subject matter of one or any combination of Aspects 1 through 3, to optionally include or use the initialization switch is located between the amplifier output and the second amplifier input.

Aspect 5 can include or use, or can optionally be combined with the subject matter of one or any combination of Aspects 1 through 4, to optionally include or use the amplifier including an operational transconductance amplifier (OTA).

Aspect 6 can include or use, or can optionally be combined with the subject matter of one or any combination of Aspects 1 through 5, to optionally include or use an analog-to-digital converter (ADC), such as coupled to the amplifier output. The control circuitry can be configured to control the ADC to perform analog-to-digital conversions of amplifier output samples of Vx and Vy.

Aspect 7 can include or use, or can optionally be combined with the subject matter of one or any combination of Aspects 1 through 6, to optionally include or use the ADC including a successive approximation routine (SAR) ADC. The control circuitry can be configured to permit powering down of the ADC between CDS analog-to-digital conversions, such as can be carried out recurrently or intermittently.

Aspect 8 can include or use, or can optionally be combined with the subject matter of one or any combination of Aspects 1 through 7, to optionally include or use the OTA being configured to be powered down between intermittent CDS samplings.

Aspect 9 can include or use, or can optionally be combined with the subject matter of one or any combination of Aspects 1 through 8, to optionally include or use the amplifier including an operational transconductance amplifier (OTA), such as with the feedback network including: a feedback capacitor between the amplifier output and the second amplifier input; and the storage capacitor being located between the second amplifier input and a ground or other reference node.

Aspect 10 can include or use, or can optionally be combined with the subject matter of one or any combination of Aspects 1 through 9, to optionally include or use first and second buffer amplifiers that can be configured to be powered down by the control circuitry such as between intermittent CDS samplings.

Aspect 11 can include or use, or can optionally be combined with the subject matter of one or any combination of Aspects 1 through 10, to optionally include or use the control circuitry being configured to alternate a temporal sequence of multiplexing Vx and Vy to the first input amplifier input between successive CDS samplings.

Aspect 12 can include or use, or can optionally be combined with the subject matter of one or any combination of Aspects 1 through 11, to optionally include or use a method of acquiring a input signal for correlated double sampling (CDS) of a differential input signal, having components Vx and Vy, for low power signal processing. The method can include initializing a storage capacitor that can be included in or coupled to a feedback network around an amplifier before a CDS sampling of an input signal. Vx can be coupled to a first amplifier input of the amplifier for a first sampling of the CDS. Vy can be coupled to the first amplifier input of the amplifier for a second sampling of the CDS without or before reinitializing the storage capacitor. A difference in an amplifier output signal of the amplifier can be sampled in response to each of Vx and Vy, such as to provide a CDS sampling of the differential input signal without or before reinitializing the storage capacitor.

Aspect 13 can include or use, or can optionally be combined with the subject matter of one or any combination of Aspects 1 through 12, to optionally include or use precharging of the first amplifier input via a buffer amplifier to which Vx is applied. The first amplifier input can be further settled without the buffer amplifier, such as by bypassing the buffer amplifier and applying Vx to the first amplifier input before sampling of Vx via the output signal of the amplifier. The first amplifier input can be precharged via a buffer amplifier to which Vy is applied. The first amplifier input can be further settled without the buffer amplifier, such as by bypassing the buffer amplifier and applying Vy to the first amplifier input before sampling of Vy via the output signal of the amplifier.

Aspect 14 can include or use, or can optionally be combined with the subject matter of one or any combination of Aspects 1 through 13, to optionally include or use sampling the output signal of the amplifier, in response to Vx being applied, after the further settling to provide a first output sample of the CDS. The output signal of the amplifier can again be sampled, in response to Vy being applied, after the further settling to provide a second output sample of the CDS. Then, CDS sampling based on the differential input signal can be provided, such as based upon a difference between the first and second output samples before or without reinitializing the storage capacitor between the first and second output samples. This difference can be obtained by performing a digital subtraction of the digitized values of the sampled amplifier outputs in response to Vy and Vx.

Aspect 15 can include or use, or can optionally be combined with the subject matter of one or any combination of Aspects 1 through 14, to optionally include or use re-initializing the storage capacitor between successive CDS samplings.

Aspect 16 can include or use, or can optionally be combined with the subject matter of one or any combination of Aspects 1 through 15, to optionally include or use powering down the amplifier between at least some of the CDS samplings.

Aspect 17 can include or use, or can optionally be combined with the subject matter of one or any combination of Aspects 1 through 16, to optionally include or use sampling of the output signal of the amplifier, such as can further include performing an analog-to-digital conversion of the amplifier output and powering down an analog-todigital converter between analog-to-digital conversions of at least some of the CDS samplings.

Aspect 18 can include or use, or can optionally be combined with the subject matter of one or any combination of Aspects 1 through 17, to optionally include or use the amplifier including an operational transconductance amplifier (OTA) such as can be configured to be capable of being powered down between at least some of the CDS samplings.

Aspect 19 can include or use, or can optionally be combined with the subject matter of one or any combination of Aspects 1 through 18, to optionally include or use an apparatus for intermittently acquiring a differential input signal, having components Vx and Vy, for low power signal processing. The apparatus can include: means for provide transconductance gain between first and second inputs and an output (e.g., an OTA); means (e.g., including a switch, control circuitry, or the like) for initializing a storage capacitor included or coupled to a feedback network before a correlated double sampling (CDS) of an input signal; means (e.g., multiplexer, switches, control circuitry, or the like) for coupling Vx to the first input for a first sampling of the CDS and for then coupling Vy to the first input without or before reinitializing the storage capacitor.

Aspect 20 can include or use, or can optionally be combined with the subject matter of one or any combination of Aspects 1 through 19, to optionally include or use means for precharging the first input based on Vx (e.g., such as can include a buffer amplifier and a multiplexor or switch and control circuitry); means for further settling the first input based on Vx (e.g., such as can include a multiplexer or a switch and control circuitry); means for precharging the first input based on Vy (e.g., such as can include a buffer amplifier and a multiplexor or switch and control circuitry); and means for further settling the first input based on Vy (e.g., such as can include a multiplexer or a switch and control circuitry.

Each of these non-limiting examples can stand on its own, or can be combined in various permutations or combinations with one or more of the other examples.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

The present document describes subject matter that can include a signal acquisition or conditioning amplifier that can be configured and controlled to use correlated doubling sampling (CDS) of a differential input signal, and a storage capacitor in a capacitive or other feedback network, a low power operational transconductance amplifier (OTA) capable of being powered down between CDS samplings, and which can be operated in a manner that provides good performance characteristics while still providing low or efficient power consumption. The amplifier and other signal processing circuitry can allow power to be scaled down, when less signal measurement throughput is needed, and to be scaled up, when more signal measurement throughput is needed. Such flexibility can help make the present approach useful for a wide range of signal acquisition and measurement applications.

Figure 1A:
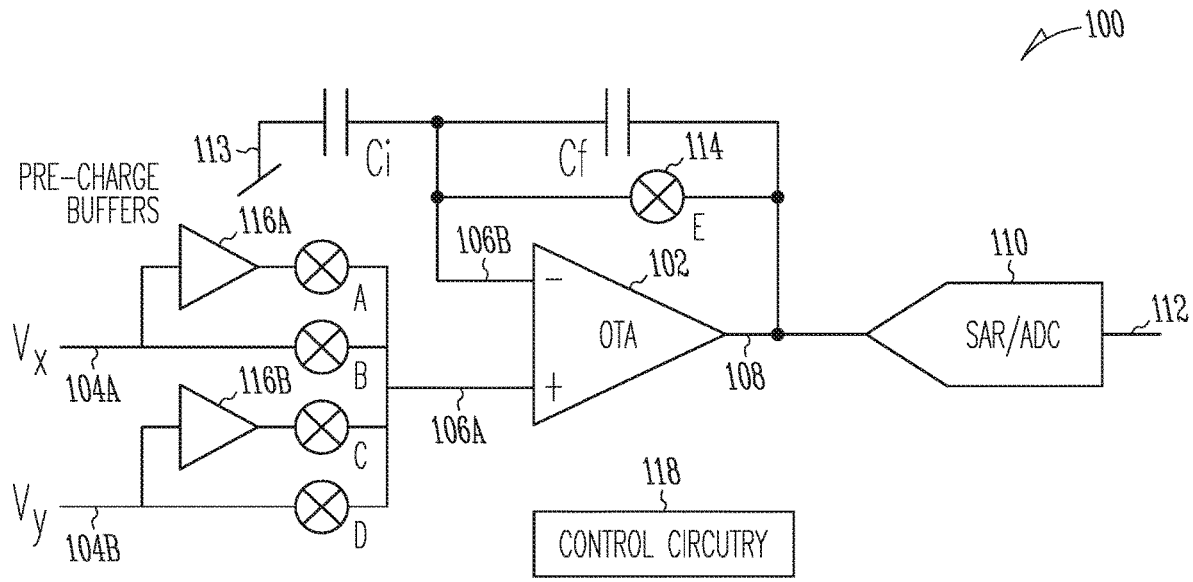
FIG. 1A is a schematic diagram showing an example of signal acquisition circuitry.
Figure 1B:
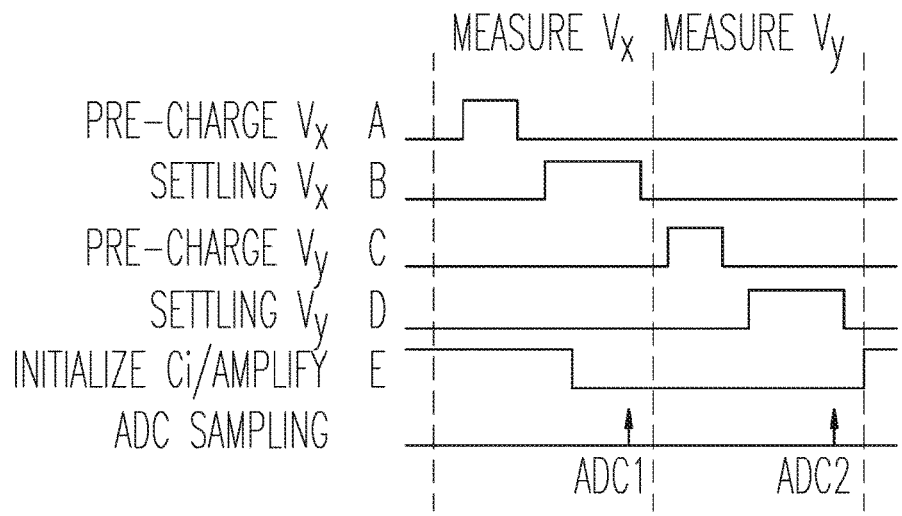
FIG. 1B is a timing diagram showing an example of operation of the signal acquisition circuitry shown in FIG. 1A.

FIG. 1A shows an example of signal acquisition circuitry 100, such as for performing correlated double sampling (CDS) on a differential input signal having components Vx and Vy, such for low power signal processing. FIG. 1B shows a timing diagram illustrating operation of various components of the signal acquisition circuitry 100 shown in FIG. 1A. In FIG. 1A, the signal acquisition circuitry 100 can include an amplifier 102 circuit, such as for signal acquisition or conditioning of the analog differential input signal having components Vx and Vy at differential signal input nodes 104A-B, respectively. In the example of FIG. 1A, the amplifier 102 can include an operational transconductance amplifier (OTA) that can operate to amplify a voltage between a first (e.g., non-inverting) amplifier input 106A and a second (e.g., inverting) amplifier input 106B into a current that can be provided at the amplifier output 108 using the transconductance gain (Gm) of the OTA. The current provided at the amplifier output 108 can be used to charge or discharge a capacitive load to provide a resulting voltage signal at the amplifier output 108 that can be converted by a successive approximation routine (SAR) or other analog-to-digital converter (ADC) 110 into a sampled digital output value at the ADC output 112. The individual components Vx and Vy of the differential input signal can be successively converted into a CDS pair of sampled digital output values at the ADC output 112. By taking a difference between these two sampled digital output values at ADC output 112 forming the CDS pair sampling instance, a differential digital output signal (corresponding to a difference between the Vx and Vy components of the differential analog input signal) can be provided using the CDS sampling instance. The ADC 110 can be powered down, such as between successive CDS sampling instances. The ADC 100 can include or be coupled to a voltage reference circuit, for providing a voltage for use in comparisons during an A2D conversion, wherein the voltage reference circuit can be configured to be also powered down, such as between successive CDS sampling instances, such as described in Coln et al. U.S. patent application Ser. No. 15/969,175 entitled POWER-CYCLING VOLTAGE REFERENCE, which was filed on May 2, 2018, and which is incorporated by reference herein in its entirety, including its description of a voltage reference suitable for being powered down.

If the signal being acquired is slow enough relative to the quick successive pair of samples of the CDS sampling shown and described with respect to FIGS. 1A, 1B, nearly the same differential signal components Vx and Vy will be present during both samples of the CDS sampling, so the signal acquisition can be still regarded as "differential" and this document will not introduce terminology such as "quasi-differential" or "pseudo-differential" to complicate this point, even though such alternative terminology could be used.

The capacitive load driven by the OTA amplifier 102 can include a storage capacitor, Ci, such as can be driven and charged or discharged by the OTA amplifier 102 via a feedback network about the OTA amplifier 102. In the example shown in FIG. 1A, the feedback network is a capacitive feedback network, such as can include a feedback capacitor, Cf, located between the amplifier output 108 and the second amplifier input 106B. The storage capacitor, Ci, can be coupled to the feedback network, such as by being coupled between the second amplifier input 106B and a ground or reference node 113. The feedback network can be used to establish a closed-loop gain around the OTA amplifier 102. In the example shown in FIG. 1A, the closed-loop voltage gain can be shown to be (Ci/Cf+1), as shown in Equation 1.

$$(Vy-Vx) = (V_{ADC2} - V_{ADC1})/(Ci/Cf+1) \quad \text{Eq. 1}$$

Using a capacitive feedback network in combination with an OTA amplifier 102 can be helpful in that the OTA amplifier 102 drives a capacitive load, yielding no quiescent current after the capacitive load is charged to a stable voltage value at the OTA amplifier output 108, unlike a resistive load, which would continue to draw a quiescent current even after the amplifier output 108 reaches a stable voltage value. Another advantage of this configuration using an OTA amplifier 102 in combination with a capacitive feedback network, is that the OTA amplifier 102 can be "output compensated" such that its stability is effected via a "dominant pole" provided by the load capacitance at the amplifier output 108 (which "sees" both the capacitance of the capacitive feedback network and that of the SAR or other ADC circuit 110. This can be compared to an operational amplifier ("op-amp") providing a voltage gain instead of a transconductance gain, which typically requires an "internal" compensation capacitor (e.g., which can be conceptualized as being "internal" to the operational amplifier, even though it may include an external capacitor coupled to internal nodes of the operational amplifier, such as between the first and second stages of a two-stage operational amplifier). The internal compensation capacitor of an operational amplifier requires a longer turn-on and turn-off time in order to stabilize, making it more difficult to power down (and to power up) an operational amplifier (e.g., recurrently between CDS samplings) than to similarly power down (and to power up) an output-compensated operational transconductance amplifier, which is not so limited.

For the capacitive feedback network shown in FIG. 1A, an initialization switch 114 can be included to initialize a voltage of the storage capacitor, Ci, at the second amplifier input 106B, which would otherwise be "floating" when a high-input impedance OTA amplifier 102 is used, such as where each of the first and second inputs 106A-B of the OTA amplifier 102 is connected internal to the OTA amplifier to a capacitive gate terminal of a field-effect transistor (FET). The initialization switch 114 can be located between the amplifier output 108 and the second amplifier input 106B, such as to auto-zero the OTA amplifier 108 when the initialization switch 114 is closed, such that the amplifier output 108 and the first and second amplifier inputs 106A-B are effectively ideally biased to the same voltage, when an offset voltage between the first and second amplifier inputs 106A-B is neglected. In reality, a small non-ideal offset voltage will appear across the first and second amplifier inputs 106A-B, however, its effect can be decreased or limited by the CDS sampling techniques described herein.

A CDS sampling instance can be carried out as follows. First, the initialization switch E can be closed to auto-zero the amplifier 102 and initialize the voltage on the storage capacitor Ci. Then, the initialization switch E can be opened and—before or without again reinitializing the storage capacitor Ci by the next closing of the initialization switch E—the differential signal components Vx and Vy can respectively be successively coupled to the first (e.g., non-inverting) input 106A of the amplifier 102, such as via corresponding switches B and D, such as shown in the timing diagram of FIG. 1B, in which a "high" signal represents a closed switch. In response to each of the differential signal components Vx and Vy successively applied to the first input 106A of the amplifier 102, the ADC can perform a sampled analog-to-digital (A2D) conversion of the voltage present at the amplifier output 108, yielding the pair of sampled digital values of the CDS sampling at times ADC1 and ADC2, such as shown in FIG. 1B. A difference between the individual digital values in the pair of sampled digital values of the CDS sampling is indicative of the differential signal present between the differential input signal nodes 104A-B. Offset voltage and 1/f noise and other noise (such as the RTI noise of the ADC 110) can be reduced or eliminated by the CDS sampling technique and arrangement such as described. Then, the OTA amplifier 102 can be powered down or even completely off, if desired, until the next CDS sampling instance is desired. The ADC 110 can similarly be powered down during this inactive time period until the next CDS sampling instance is desired. At that time, the OTA amplifier 102, the ADC 110, or both can be powered back up, and the storage capacitor Ci can be re-initialized, such as in the matter described above, for taking another CDS sampling without re-initializing the storage capacitor Ci between individual samples of the pair of samplings in the CDS sampling instance.

Because charging or discharging the input capacitance at the first input 106A of the OTA amplifier 102 can be viewed as an effective input current into the first input 106A of the OTA amplifier 102, some degree of loading of the sensor or other signal source providing the input signal at the input nodes 104A-B may exist. Certain sensors may be affected by such an effective load current, which may affect sensor measurement accuracy. However, this can be ameliorated by including the buffer amplifiers 116A-B, each with a respective buffer amplifier input coupled to one of the differential signal inputs 104A-B, and each with a respective buffer amplifier output coupled via a respective one of switches A and C to the first input 106A of the amplifier 102. The buffer amplifiers 116A-B can respectively be used for pre-charging the first input 106A (supplied by charge drawn from a power supply powering the buffer amplifier, rather than by charge drawn from the sensor or other signal source that may have its accuracy impacted by such an effective load current).

For example, as shown in the timing diagram of FIG. 1A, the differential signal component Vx can be first connected to the first input 104 of the amplifier 102 by closing the switch A, for pre-charging the first input 104 of the amplifier 102 via the buffer amplifier 116A. Then, switch A can be opened, and switch B can be closed to connect the actual signal component Vx to the first input 104 of the amplifier 102 for further settling, bypassing the buffer amplifier 116A, yielding immunity to noise performance or offset non-idealities of the buffer amplifier 116A.

Then, for example, as shown in the timing diagram of FIG. 1A, the differential signal component Vy can be first connected to the first input 104 of the amplifier 102 by closing the switch C, for pre-charging the first input 104 of the amplifier 102 via the buffer amplifier 116B. Then, switch C can be opened, and switch D can be closed to connect the actual signal component Vy to the first input 104 of the amplifier 102 for further settling, bypassing the buffer amplifier 116B, yielding immunity to noise performance or offset non-idealities of the buffer amplifier 116B. Buffer amplifiers 116A-B can be matched to each other to improve performance. Control circuitry 118 can be included in or coupled to the signal acquisition circuitry 100, such as to provide the control signals for operating the switches shown, the ADC 110, or both, such as to control operation as indicated in the timing diagram of FIG. 1B. The control circuitry 118 can include a dedicated digital hardware circuit, a programmable microcontroller circuit, or can use one or more of various other general-purpose or dedicated circuit implementations. The control circuitry 118 can control a multiplexer circuit, such as can include some or all of switches A, B, C, or D, shown in FIG. 1A.

The control circuitry 118 can be configured and operated to alter the sequencing of acquisition of the differential signal components Vx and Vy, such as alternatingly between successive CDS samplings. For example, the first CDS instance sampling pair could be acquired as Vx then Vy, the second CDS instance sampling pair could be acquired as Vy then Vx, the third CDS instance sampling pair could be acquired as Vx then Vy, and so forth, with operation of the ADC similarly alternatingly provided with a signal inversion to maintain a consistency in the differential digital signal output at the ADC output 112.

The feedback network around the OTA amplifier 102 need not be a capacitive feedback network. Resistive feedback or a combination of resistive and reactive feedback can be provided, however, the capacitive feedback as shown advantageously does not require an ongoing quiescent current after the amplifier output 108 reaches the desired value.

The circuitry, apparatus, systems, and methods such as shown and describe herein can help provide several advantages. For example, initializing the storage capacitor Ci to the a bias voltage given by one component of the differential input signal (e.g., Vx) can help permit amplification of the differential signal (the difference between Vx and Vy) without overloading the amplifier 102. In an example, the use of the CDS technique described herein can help reject offsets and low-frequency noise, particularly 1/f noise, in the signal acquisition circuitry 100. The CDS sampling can also help reject a common-mode signal as can be approximated by the differential signal component Vx. In an example, the ADC 110 can transform the two sampled values (based on Vx and Vy, respectively) into the digital domain, such that the differencing or correlation can be obtained using a simple digital subtraction of the two values. In an example, the pre-charge buffers 116A-B can supply the charge needed to shift the amplifier input capacitance between Vx and Vy, such that the sensor or other input signal source does not see this input-current loading at its output, to which the sensor may be sensitive. All of the amplifiers and the ADC can be efficiently power cycled, such as to power down one or all such components between CDS sampling instances, which can be carried out recurrently as often or as infrequently as needed by a particular application.

The above description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Geometric terms, such as "parallel", "perpendicular", "round", or "square", are not intended to require absolute mathematical precision, unless the context indicates otherwise. Instead, such geometric terms allow for variations due to manufacturing or equivalent functions. For example, if an element is described as "round" or "generally round," a component that is not precisely circular (e.g., one that is slightly oblong or is a many-sided polygon) is still encompassed by this description.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the The claimed invention is:

1. A signal acquisition circuitry for performing correlated double sampling (CDS) on a differential input signal, having components Vx and Vy, for low power signal processing, the circuitry comprising:
   an amplifier, including or coupled to feedback network, the feedback network including or coupled to a storage capacitor, the amplifier configured to provide gain between first and second amplifier inputs and an amplifier output;
   an initialization switch, arranged to initialize the storage capacitor before the CDS of the input signal;
   control circuitry, configured to control operation of a multiplexer to sequentially couple Vx and Vy to the first amplifier input for respective first and second samplings of the CDS performed without or before reinitializing the storage capacitor; and
   an analog-to-digital converter (ADC), coupled to the amplifier output, and wherein the control circuitry is configured to control the ADC to perform analog-to-digital conversions of amplifier output samples of Vx and Vy for differencing of the digital representations of Vx and Vy to provide the correlation of the CDS in the digital domain.

2. The circuitry of claim 1, comprising:
   a first precharge switch, configured to be controlled by the control circuitry to couple Vx to the first amplifier input via a first buffer amplifier for precharging the first amplifier input;
   a first settling switch, configured to be controlled by the control circuitry to then couple Vx, to the first amplifier input without the first buffer amplifier for further settling the first amplifier input after precharging;
   a second precharge switch, configured to be controlled by e control circuitry to couple Vy to the first amplifier input via a second buffer amplifier for precharging the first amplifier input; and
   a second settling switch, configured to be controlled by the control circuitry to then couple Vy to the first amplifier input without the second buffer amplifier for further settling the first amplifier input after precharging.

3. The circuitry of claim 2, wherein the initialization switch is, arranged to initialize the storage capacitor before the CDS that includes precharging, settling, and sampling of each of Vx and Vy before reinitializing the storage capacitor.

4. The circuitry of claim 1, wherein the initialization switch is located between the amplifier output and the second amplifier input.

5. The circuitry of claim 1, wherein the amplifier includes an operational transconductance amplifier (OTA).

6. The circuitry of claim 5, wherein the OTA is configured to be powered down between intermittent CDS samplings.

7. The circuitry of claim 1, wherein the ADC includes a successive approximation routine (SAR) ADC, and wherein the control circuitry is configured to permit powering down of the ADC between intermittent CDS analog-to-digital conversions.

8. The circuitry of claim 1, wherein the control circuitry is configured to alternate a temporal sequence of multiplexing Vx and Vy to the first input amplifier input between successive CDS samplings.

9. The circuitry of claim 1, wherein the amplifier includes an operational transconductance amplifier (OTA), and wherein the feedback network includes:
   a feedback capacitor between the amplifier output and the second amplifier input; and
   the storage capacitor being located between the second amplifier input and a ground or other reference node.

10. The circuitry of claim 2, wherein the first and second buffer amplifiers are configured to be powered down by the control circuitry between intermittent CDS samplings.

11. A method of acquiring a input signal for correlated double sampling (CDS) of a differential input signal, having components Vx and Vy, for low power signal processing, the method comprising:
   initializing a storage capacitor included in or coupled to a feedback network around an amplifier before a CDS sampling of an input signal;
   coupling Vx to a first amplifier input of the amplifier for a first sampling of the CDS;
   coupling Vy to the first amplifier input of the amplifier for a second sampling of the CDS without or before reinitializing the storage capacitor; and
   sampling a difference in an amplifier output signal of the amplifier in response to each of Vx and Vy for analog-to-digital conversions of each of Vx and Vy for differencing of digital representations of Vx and Vy to provide correlation of a CDS sampling of the differential input signal without or before reinitializing the storage capacitor.

12. The method of claim 11, wherein the amplifier includes an operational transconductance amplifier (OTA) configured to be capable of being powered down between at least some of the CDS samplings.

13. The method of claim 11, comprising:
   precharging the first amplifier input via a buffer amplifier to which Vx is applied;
   further settling the first amplifier input without the buffer amplifier by applying Vx to the first amplifier input before sampling of Vx via the output signal of the amplifier;
   precharging the first amplifier input via a buffer amplifier to which Vy is applied; and
   further settling the first amplifier input without the buffer amplifier by applying Vy to the first amplifier input before sampling of Vy via the output signal of the amplifier.

14. The method of claim 13, comprising:
   sampling the output signal of the amplifier, in response to Vx being applied, after the further settling to provide a first output sample of the CDS;
   sampling the output signal of the amplifier, in response to Vy being applied, after the further settling to provide a second output sample of the CDS; and
   providing the CDS sampling based upon a difference between the first and second output samples before or without reinitializing the storage capacitor between the first and second output samples.

15. The method of claim 14, comprising re-initializing the storage capacitor between successive CDS samplings.

16. The method of claim 13, comprising powering down the amplifier between at least some of the CDS samplings.

17. An apparatus for intermittently acquiring a differential input signal, having components Vx and Vy, for low power signal processing, the apparatus comprising:
- means for provide transconductance gain between first and second inputs and an output;
- means for initializing a storage capacitor included or coupled to a feedback network before a correlated double sampling (CDS) of an input signal;
- means for coupling Vx to the first input for a first sampling of the CDS and for then coupling Vy to the first input without or before reinitializing the storage capacitor; and
- an analog-to-digital converter (ADC), configured to control the ADC to perform analog-to-digital conversions of amplified output samples of Vx and Vy for differencing of digital representations of Vx and Vy to provide the correlation of the CDS in the digital domain.

18. The apparatus of claim 17, comprising:
- means for precharging the first input based on Vx;
- means for further settling the first input based on Vx;
- means for precharging the first input based on Vy; and
- means for further settling the first input based on Vy.

19. A signal acquisition circuitry for performing correlated double sampling (CDS) on a differential input signal, having components Vx and Vy, for low power signal processing, the circuitry comprising:
- an amplifier, including a differential arrangement of a first amplifier input and a second amplifier input and a single-ended amplifier output, the amplifier including or coupled to a feedback network, the feedback network including or coupled to a storage capacitor, the amplifier configured to provide gain between the first and second amplifier inputs and the single-ended amplifier output;
- an initialization switch, arranged to initialize the storage capacitor before the CDS of the input signal; and
- control circuitry, configured to control operation of a multiplexer to sequentially couple Vx and Vy to the same first amplifier input for respective first and second samplings of single-ended amplifier output for subsequent differencing of the respective first and second samplings of single-ended amplifier output for CDS performed without or before reinitializing the storage capacitor.

20. The circuitry of claim 19, further comprising an analog-to-digital converter (ADC), coupled to the single-ended amplifier output, and wherein the control circuitry is configured to control the ADC to perform analog-to-digital conversions of amplifier output samples of Vx and Vy.

21. The method circuitry of claim 19, wherein the sampling of the single-ended output signal of the amplifier further includes performing an analog-to-digital conversion of the single-ended amplifier output and powering down an analog-to-digital converter between analog-to-digital conversions of at least some of the CDS samplings.

* * * * *

UNITED STATES PATENT AND TRADEMARK OFFICE
CERTIFICATE OF CORRECTION

PATENT NO. : 10,809,792 B2  
APPLICATION NO. : 16/103963  
DATED : October 20, 2020  
INVENTOR(S) : Coln et al.

Page 1 of 1

It is certified that error appears in the above-identified patent and that said Letters Patent is hereby corrected as shown below:

In Column 11, Line 44, in Claim 2, delete "e" and insert --the-- therefor

In Column 14, Line 22, in Claim 21, before "circuitry", delete "method"

Signed and Sealed this  
Twenty-ninth Day of December, 2020

Andrei Iancu  
*Director of the United States Patent and Trademark Office*